（12) United States Patent
Boja et al.

(10) Patent No.: US 11,201,095 B1
(45) Date of Patent: Dec. 14, 2021

(54) CHIP PACKAGE HAVING A COVER WITH WINDOW

(71) Applicant: XILINX, INC., San Jose, CA (US)

(72) Inventors: Ronilo Boja, Gilroy, CA (US); Inderjit Singh, Saratoga, CA (US); Gerilyn Maloney, Los Altos, CA (US); Chandan Bhat, Sunnyvale, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/549,801

(22) Filed: Aug. 23, 2019

(51) Int. Cl.
*H01L 23/049* (2006.01)
*H01L 23/24* (2006.01)
*H01L 23/31* (2006.01)
*H01L 21/56* (2006.01)

(52) U.S. Cl.
CPC .......... *H01L 23/049* (2013.01); *H01L 21/565* (2013.01); *H01L 23/24* (2013.01); *H01L 23/3107* (2013.01)

(58) Field of Classification Search
CPC ... H01L 23/049; H01L 23/24; H01L 23/3107; H01L 21/565; H01L 21/56; H01L 23/31
USPC .......................................................... 257/780
See application file for complete search history.

(56) References Cited

U.S. PATENT DOCUMENTS

| | | | |
|---|---|---|---|
| 6,232,652 B1 | 5/2001 | Matsushima | |
| 6,413,474 B1 | 7/2002 | Igel et al. | |
| 6,882,041 B1 * | 4/2005 | Cheah | H01L 21/54 257/667 |
| 7,019,335 B2 * | 3/2006 | Suenaga | H01L 24/49 257/99 |
| 7,187,077 B1 | 3/2007 | Nagarajan | |
| 7,378,733 B1 | 5/2008 | Hoang et al. | |
| 7,402,458 B2 * | 7/2008 | Haskett | G02B 26/0841 257/E23.118 |
| 7,696,006 B1 | 4/2010 | Hoang et al. | |
| 8,258,013 B1 | 9/2012 | Nagarajan et al. | |
| 9,679,784 B2 * | 6/2017 | Tong | G02B 6/12002 |
| 10,043,730 B2 | 8/2018 | Refai-Ahmed et al. | |
| 2003/0056392 A1 | 3/2003 | Boroson et al. | |
| 2006/0018925 A1 | 1/2006 | Tripp et al. | |
| 2006/0076695 A1 | 4/2006 | Hsieh et al. | |
| 2007/0045819 A1 | 3/2007 | Edwards et al. | |
| 2007/0284704 A1 | 12/2007 | Leal et al. | |
| 2018/0026010 A1 * | 1/2018 | Huang | H01L 23/3114 257/659 |
| 2020/0321261 A1 * | 10/2020 | Fujino | H01L 21/561 |

* cited by examiner

*Primary Examiner* — Alexander O Williams
(74) *Attorney, Agent, or Firm* — Patterson + Sheridan, LLP

(57) ABSTRACT

A chip package and method for fabricating the same are provided which utilize a cover having one or more windows formed through one or more sidewalls to provide excellent resistance to warpage while allowing access to an internal volume of the chip package. In one example, the chip package includes a package substrate, an integrated circuit (IC) die, and a cover disposed over the IC die. The cover includes a lower surface facing the IC die, an upper surface facing away from the IC die, a lip extending from the lower surface, and a first sidewall extending from a first edge of the upper surface to the bottom of the lip. The lip is secured to the package substrate and encloses a volume between the lower surface and the package substrate. The IC die resides in the volume. A first elongated window is formed through the first sidewall and exposes the volume through the cover.

16 Claims, 4 Drawing Sheets

US 11,201,095 B1

CHIP PACKAGE HAVING A COVER WITH WINDOW

TECHNICAL FIELD

Embodiments of the present invention generally relate to a chip package, and in particular, to chip package having an integrated circuit (IC) die and cover having a window disposed on a package substrate.

BACKGROUND

Electronic devices, such as tablets, computers, copiers, digital cameras, smart phones, control systems and automated teller machines, among others, often employ electronic components which leverage chip package assemblies for increased functionality and higher component density. Conventional chip packaging schemes often utilize a plurality of integrated circuit (IC) dies to be mounted to a single package substrate. The IC dice may include memory, logic or other IC devices.

Out of plane deformation of the chip package can be problematic to conventional chip packaging schemes. In many instances, a cover or tubular stiffener is utilized to stiffen the chip package against out of plane deformation. However, particularly in larger chip package assemblies, the cover itself may bend or twist, or even become delaminated from chip package, thus still permitting undesirable warpage and bending during manufacture and/or use. Such warpage and bending of the chip package can lead to solder connection failure or other damage to the components and devices of the chip package, which may detrimentally effect device performance and reliability.

In some applications, it may be desirable to access the interior or the chip package during and/or after assembly. Access is often provided by spacing a cover of the chip package above a substrate to which the IC dies are mounted utilizing corner posts. Although the space between the corner posts does provide access to the interior of the chip package, such designs still permit an undesirable amount of warpage, and thus, have not shown to be a robust solution.

Therefore, a need exists for an improved chip package, and in particular, to a chip package having an improved cover.

SUMMARY

A chip package and method for fabricating the same are provided which utilize a cover having one or more elongated windows formed through one or more sidewalls to provide excellent resistance to warpage while allowing access to an internal volume of the chip package. In one example, the chip package includes a package substrate, an integrated circuit (IC) die, and a cover disposed over the IC die. The cover includes a lower surface facing the IC die, an upper surface facing away from the IC die, a lip extending from the lower surface, and a first sidewall extending from a first edge of the upper surface to the bottom of the lip. The lip is secured to the package substrate and encloses a volume between the lower surface and the package substrate. The IC die resides in the volume. A first elongated window is formed through the first sidewall and exposes the volume through the cover.

In another example, a chip package is provided that includes a package substrate, an integrated circuit (IC) die, and a cover disposed over the IC die. The cover includes a lower surface facing the IC die, an upper surface facing away from the IC die, a lip extending from the lower surface, a first sidewall extending from a first edge of the upper surface to the bottom of the lip, and a second sidewall extending from a second edge of the upper surface to the bottom of the lip, the second sidewall facing away from the first sidewall. A first elongated window is formed through the first sidewall and the upper surface, while a second elongated window formed through the second sidewall and the upper surface. The first and second elongated windows expose the volume through the cover.

In yet another example, a method of fabricating a chip package is provided that includes mounting an integrated circuit (IC) die to a package substrate, and adhering sidewalls of the cover to the package substrate in a manner that contiguously contacts the sidewalls to the package substrate while circumscribing the IC die. The cover has one or more windows formed through the sidewalls that expose the IC die through the cover.

Optionally, the method may also include one or both of disposing a cleaning fluid through the one or more windows, and disposing a molding material through the one or more windows, the molding material encapsulating the IC die.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

A chip package and method for fabricating the same are provided that utilize an improved cover. The cover includes one or more elongated windows that allow access to an internal volume of the chip package without significantly compromising the resistance to warpage provided by the cover. The chip package described herein includes at least one integrated circuit (IC) die and a cover with an elongated window disposed on a substrate, such as a package substrate. The elongated window beneficially allows access to the interior of the chip package in a manner that allows one or more additional processes to be performed on the chip package. These beneficial additional processes includes at least one or more of, but is not limited to, cleaning the IC die or other surfaces within the internal volume, cooling the IC die utilizing gas flow introduced through the window, and encapsulating the IC die, among others. Moreover, as the windows do not interrupt portion of the cover providing a 360 degrees contiguous attachment of the cover to the package substrate, the resistance of the cover to warpage is very robust and contributes to enhanced reliability of the solder connections throughout the chip package. The resulting chip package with cover thus provides increased the resistance to out of plane deformation during the fabrication and use of the chip package, which enhances the reliability of the die to package substrate electrical connections. Advantageously, the enhanced stiffness of the chip package improves reliability and performance.

Figure 1:
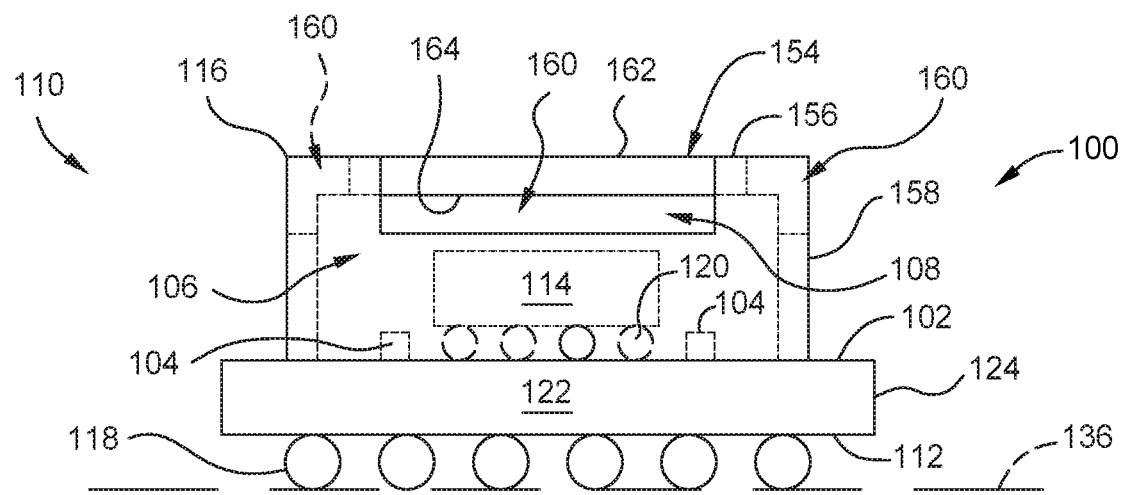
FIG. 1 is a front schematic view of an electronic device having an integrated chip package, the integrated chip package having one example of a cover with an elongated window.

Turning now to FIG. 1, an exemplary integrated chip package 110 is schematically illustrated disposed on a printed circuit board (PCB) 136. A front view of the chip package 110 is shown in FIG. 1, with selected interior component shown in phantom. The chip package 110 and the PCB 136 together form at least part of an electronic device 100. The electronic device 100 may be a tablet, computer, copier, digital camera, smart phone, control system, automated teller machine, server or other solid-state memory and/or logic device.

The chip package 110 includes at least one IC die 114 mounted to a package substrate 122, and a cover 154 having at least one or more elongated windows 160. The cover 154 is coupled to the package substrate 122. In one example, the cover 154 is coupled to the package substrate 122 proximate to an outer edge 124 of the package substrate 122, thus circumscribing the IC die 114. The cover 154 beneficially enhances the resistance of the package substrate 122, and consequently the chip package 110, against out of plane deformation, as further discussed below. Optionally, an interposer may be disposed between the IC die 114 and the package substrate 122. Although a single IC die 114 is shown in the example depicted in FIG. 1, the number of IC die 114 may range from one to as many as can be fit within the chip package 110.

The package substrate 122 includes circuitry for electrically connecting the IC die 114 to circuitry of the package substrate 122. The circuitry of the package substrate 122 may optionally include transistors and/or other circuit elements. For example, one or more surface mounted circuit components 104 may be coupled to a top surface 102 of the package substrate 122 in a region (i.e., space) defined between the inner side of the cover 154 and the side of the IC die 114. The surface mounted circuit components 104 may be one or more of a capacitor, diode, resistor, inductor, or other suitable discrete circuit element. The surface mounted circuit components 104 are soldered to a conductor residing on or in the package substrate 122, and are coupled to the circuitry of the IC die 114 through the circuitry of the package substrate 122.

Solder connections 120, also known as or "micro bumps," are utilized to provide mechanical and electrical connections between the circuitry of the IC die 114 and the circuitry of the package substrate 122. The solder connections 120, when in the form of solder joints, may be fabricated from tin-lead solder, lead-free solder or other suitable solder. In the example depicted in FIG. 1, solder connections 120 couple the bottom side of the IC die 114 to the top surface 102 of the package substrate 122. Underfill, not shown, may be utilized to fill the space not taken by the solder connections 120 between the IC die 114 and the package substrate 122.

Solder connections 118, also known as or "solder balls," are utilized to provide mechanical and electrical connections between the circuitry of the PCB 136 and the circuitry of the package substrate 122. Alternatively, the package substrate 122 may be coupled to the PCB 136 by wire bonding or other suitable technique. In the example depicted in FIG. 1, solder connections 118 couple the bottom surface 112 of the package substrate 122 to a top surface of the PCB 136.

As discuss above, the IC die 114 is mounted to the top surface 102 the package substrate 122. The IC die 114 may be programmable logic devices, such as field programmable gate arrays (FPGA), memory devices, optical devices, processors or other IC logic structures. Optical devices include photo-detectors, lasers, optical sources, and the like.

The cover 154 is coupled to the top surface 102 of the package substrate 122 above the IC die 114 in a manner that enhances the resistance of the package substrate 122 to out of plane deformation. The cover 154 may be fabricated from metals, ceramics, thermoplastics, glass reinforced plastics, and carbon reinforced materials, among others. In one example, the cover 154 may be made of ceramic, metal or other various inorganic materials, such as aluminum oxide ($Al_2O_3$), aluminum nitride (AlN), silicon nitride (SiN), silicon (Si), copper (Cu), aluminum (Al), and stainless steel, among other materials. When fabricated from a thermally conductive material such as a metal, the cover 154 may be utilized as a heat spreader and/or heat sink that enhances thermal management (i.e., temperature control) of the IC die 114.

Figure 2:
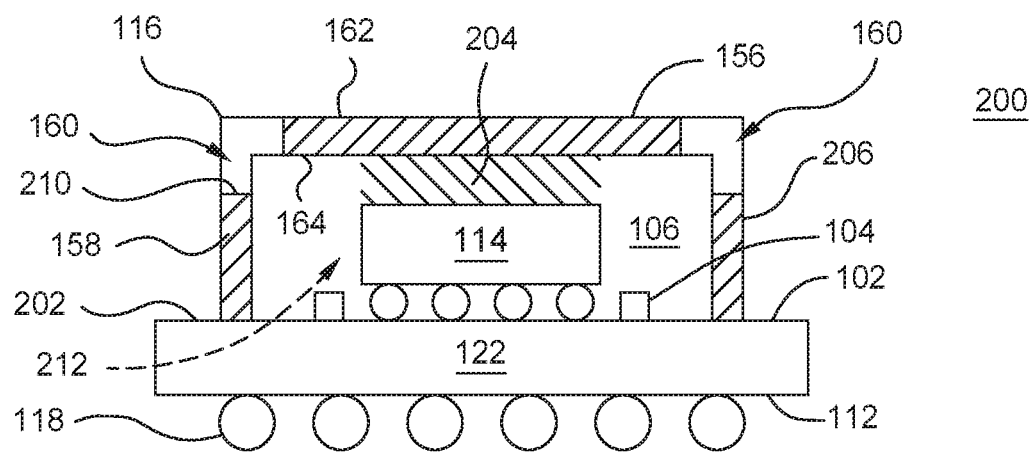
FIG. 2 is a front schematic view of integrated chip package depicted in FIG. 1 illustrating the cover in cross section.

Referring additionally now to the sectional view of the cover 154 depicted in FIG. 2, the cover 154 includes a top 156 and a lip 158. The top 156 and the lip 158 may be formed from a single mass of material, or may be formed from multiple components. The top 156 and the lip 158 may be formed by stamping, milling, machining, molding, casing, an additive manufacturing process (such as 3-D printing), electric-discharge machining (EDM), or other suitable technique.

The top 156 and the lip 158 enclose an internal volume 106 of the chip package 110 in which the IC die 114 resides. The top 156 includes an upper surface 162 and a lower surface 164. The upper surface 162 faces away from the lower surface 164, while the lower surface 164 faces the top surface 102 of the package substrate 122 and a top surface of the IC die 114. Although in the example of FIG. 1 the lip 158 has a perpendicular orientation relative to the top 156, the lip 158 may be inclined at an angle other than 90 degrees relative to the top 156. The internal volume 106 of the chip package 110 is defined between the lower surface 164 of the top 156 of the cover 154 and the top surface 102 of the package substrate 122.

In one example, a thermal interface material (TIM) 204 may be disposed between the top surface of the IC die 114 and the lower surface 164 of the top 156 of the cover 154 to promote heat transfer therebetween. In one example, the TIM 204 may be a thermally conductive grease, thermally conductive epoxy or other suitable heat transfer promoting material.

In another example, some or all of the internal volume 106 may be filled with a molding material 212 (shown in phantom). Optionally, TIM 204 may be utilized between the IC die 114 and the cover 154 in addition to the molding material 212. In one example, the molding material 212 may be a polymer, epoxy or other suitable material. In another example, the molding material 212 may be a polymeric potting compound, epoxy, silicone, silicone with fillers, or a room-temperature-vulcanizing (RTV) silicone, among others. The molding material 212 provides additional stiffness to the chip package 110, while protecting the surface mounted circuit components 104 and IC die 114 from an environment 200 located outside of the chip package 110.

The lip 158 is coupled to the lower surface 164 of the top 156 of the cover 154. The lip 158 extends, in one or more examples, in a direction that is perpendicular from the plane of the lower surface 164 and away from the upper surface 162. The lip 158 terminates at a distal end 202 that is secured in contact with the top surface 102 of the package substrate 122. In one example, the distal end 202 of the lip 158 is secured to the top surface 102 of the package substrate 122 utilizing an adhesive, such as an epoxy or other bonding agent. In another example, the distal end 202 of the lip 158 is secured to the top surface 102 of the package substrate 122 utilizing clamps or fasteners.

Figure 4:
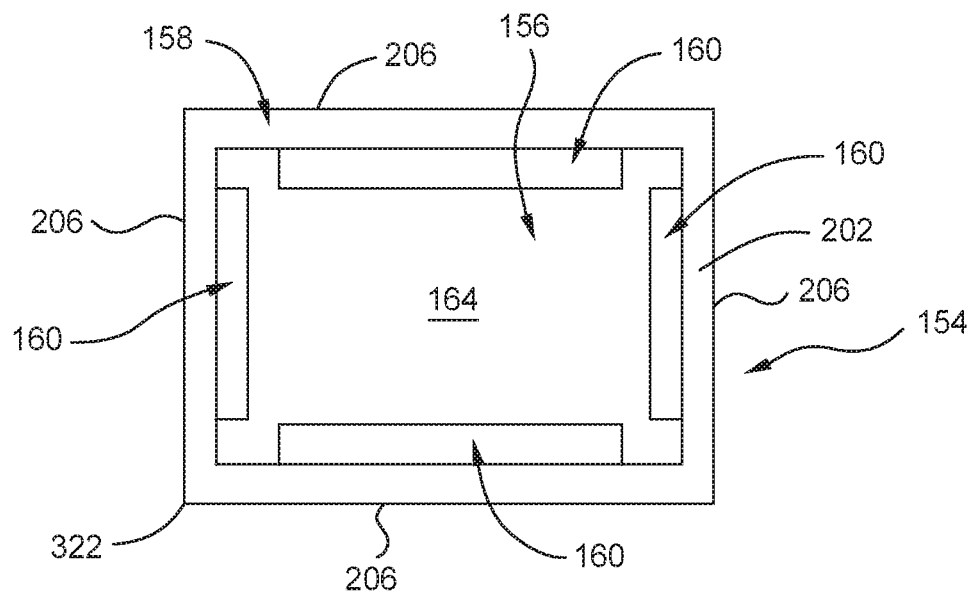
FIG. 4 is a bottom view of the cover of the electronic device of FIG. 1.

Referring additionally to a bottom view of the cover 154 depicted in FIG. 4, the lip 158 additionally continually circumscribes the IC die 114 such that the distal end 202 of the lip 158 make continuous and uninterrupted contact with the top surface 102 of the package substrate 122. In this manner, the distal end 202 of the lip 158 is continuously secured to the top surface 102 of the package substrate 122 around the entire periphery of the top surface 102 of the package substrate 122. Thus, the continuously secured lip 158 provides improved rigidity and resistance of the cover 154 to warpage compared to convention lips that make intermittent contact with the top surface 102 of the package substrate 122.

Referring back to FIG. 1 and FIG. 2, the cover 154 also includes sidewalls 206 that generally begin at the upper surface 162 of the top 156 and extend along the exterior (i.e., opposite the internal volume 106) of the lip 158 and terminates at the distal end 202 of the lip 158. At least one of the sidewalls 206 includes an elongated window 160 formed therethrough. The window 160 is elongated in a direction parallel to the top surface 102 of the package substrate 122, which advantageously allows improved access to the IC die 114 and surface mounted circuit components 104, as further described below, without compromising the stiffness of the cover 154. The window 160 may be formed completely within the lip 158; or may be formed partially within both the top 156 and the lip 158. As such, each sidewall 206 having a window 160 terminates at a window edge 210 where the sidewall 206 meets the window 160, and a horizontal edge 116 where the sidewall 206 meets the upper surface 156 of the cover 154. As such, a portion of the sidewall 206 defined by the lip 158 remains between the window 160 and the distal end 202 of the lip 158.

As referenced herein, "horizontal" infers a direction parallel to the plane of the upper surface 156 of the cover 154 such as illustrated by the edge 116, while "vertical" infers a direction perpendicular to the plane of the upper surface 156 of the cover 154. Similarly, the adjective "upper" infers a location closer to the upper surface 156 of the cover 154 than "lower" positon that is relatively farther from the upper surface 156 of the cover 154. It is contemplated that the plane of the upper surface 162 of the cover 154 may be rotated from true horizontal, and that the terms horizontal, vertical, upper and lower are utilized herein using the plane of the upper surface 156 of the cover 154 as the upper most horizontal reference of the chip package 110 as illustrated in FIG. 1.

The elongated window 160 allows relatively large (as compared to the width of the IC die 114) access to the internal volume 106 of the chip package 110 from the environment 200 exterior to the chip package 110. The window 160 may be utilized for venting, cooling, cleaning or depositing material (such as TIM, encapsulant, underfill, and adhesives, among others) within the internal volume 106 of the chip package 110. The relative large width of the elongated window 160 enhances the ability to clean wide areas within the internal volume 106, precisely dispense materials within the within the internal volume 106 and to efficiently cool the IC die 114 by proving a wide passage that does not overly restrict air flow coming into or exiting the internal volume 106.

As discussed above, at least one of the sidewalls 206 of the cover 154 may have one or more windows 160 formed therethrough. In one example, only one sidewall 206 of the cover 154 has a window 160 formed therethrough. In another example, oppose sidewalls 206 of the cover 154 have a window 160 formed therethrough. In yet another example, every sidewall 206 of the cover 154 has a window 160 formed therethrough. In the embodiment illustrated in FIGS. 1 and 2, the window 160 is defined by a single aperture 108 through which the internal volume 106 is open (i.e., exposed) to the environment 200 located outside of the chip package 110.

Similar to the window 160, the aperture 108 is also elongated in the same direction as the window 160. For example, the aperture 108 may be a slot, such as a substantially rectangular slot. The aperture 108 may also have other elongated shapes. Generally, a width to height ratio of the aperture 108 is at least 10:1, and may be up to 20:1 or even greater. In an exemplary embodiment having multiple apertures 108 per window 160, each aperture 108 at least a 3:1 ratio, and the sum of the widths of the apertures 108 comprising the window 160 has a width to height ratio of at least 10:1, and may be up to 20:1 or even greater. The high width to height ratio of the aperture 108 advantageously allows wide access across the internal volume of the chip package 110 as further described below.

Figure 3:
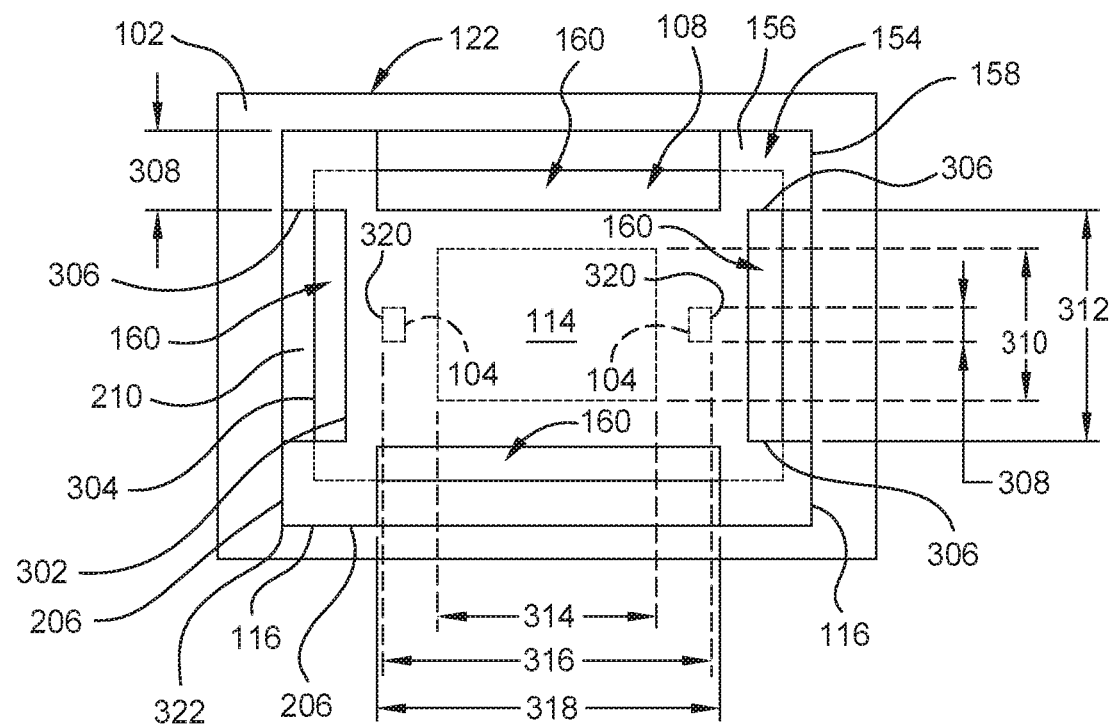
FIG. 3 is a top view of the electronic device of FIG. 1 illustrating one configuration of a cover.

FIG. 3 is a top view of the chip package 110 illustrating the surface mounted circuit components 104 and IC die 114 in phantom through the cover 154. The aperture 108 generally extends from the sidewall 206 to an inner wall 302 formed through the top 156 of the cover 154. The aperture 108 formed through the sidewall 206 closest the surface mounted circuit components 104 generally has a width 312 defined by opposing sides 306 of the window 160 in a direction coplanar with the sidewall 206 in which the window 160 resides that is also perpendicular to vertical edges 322 defined at the intersections of adjacent sidewalls 206, and parallel to the horizontal edge 116. The width 312 of the aperture 108 is generally wider than a width 310 of the IC die 114 in the same direction. Additionally, the width 310 of the IC die 114 is generally wider than a width 308, in the same direction, of the outermost edges of the surface mounted circuit components 104. Stated differently, the width 312 of the aperture 108 also generally wider than width 308 of the surface mounted circuit components 104. The wider width 312 of the aperture 108 beneficially allows easy access to the regions outward of the IC die 114 to facilitate one or more of cleaning of the surface mounted circuit components 104, cooling of the IC die 114, application of TIM 204 and dispensing of molding material 212 into the internal volume 106 of the chip package 110 to encapsulate the IC die 114, depending on the desired application. In embodiments where two windows 160 having widths 312 of the aperture 108 wider than the width 310 of the IC die 114 facilitates cross flow through the internal volume 106 around the IC die 114 for enhanced cooling, as needed depending on the application.

Similarly, the aperture 108 formed through the sidewall 206 ninety degrees offset from the sidewall 206 closest the surface mounted circuit components 104 generally has a width 318 defined by opposing sides 306 of the window 160. The width 318 of the aperture 108 is generally wider than a width 316 defined by the opposing sides 320 of the surface mounted circuit components 104 mounted on either side of the IC die 114. Additionally, the width 314 of the IC die 114 is generally narrower than the width 316 of the surface mounted circuit components 104. The wider width 318 of the aperture 108 allows easy access to the regions outward of the IC die 114 where the surface mounted circuit components 104 are located to facilitate cleaning of the surface mounted circuit components 104. The wider width 318 of the aperture 108 facilitates one or more of cooling of the IC die 114, application of TIM 204 and dispensing of molding material 212 into the internal volume 106 of the chip package 110 to encapsulate the IC die 114, as needed depending on the application.

It should be noted that in example having a single aperture 108 per window 160, the width of the window 160 is at least equal to than the width of the aperture 108.

Figure 5:
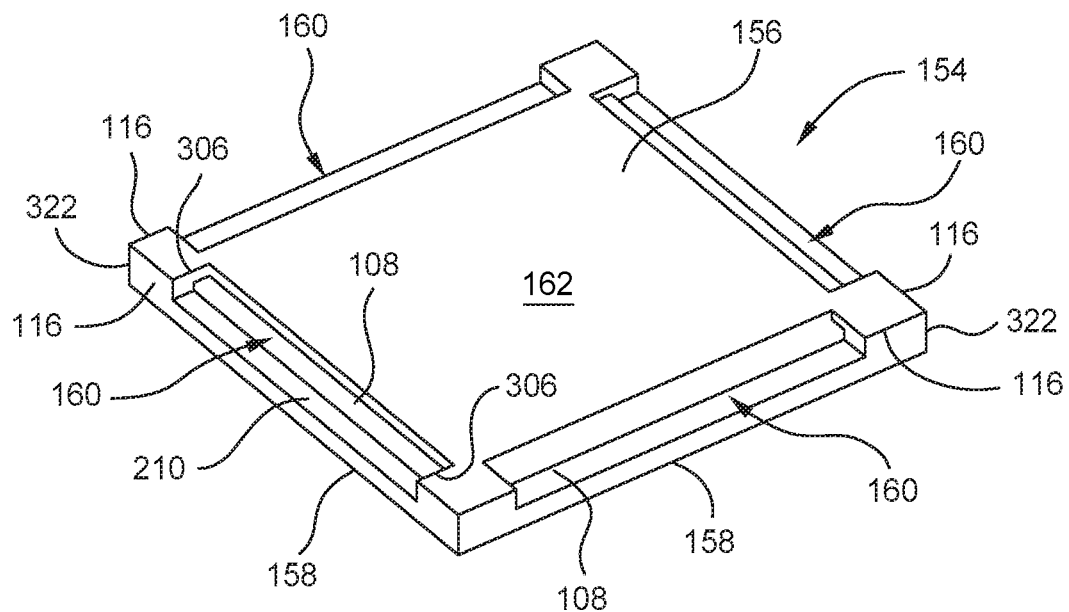
FIG. 5 is a top isometric view of the cover of FIG. 4.
Figure 6:
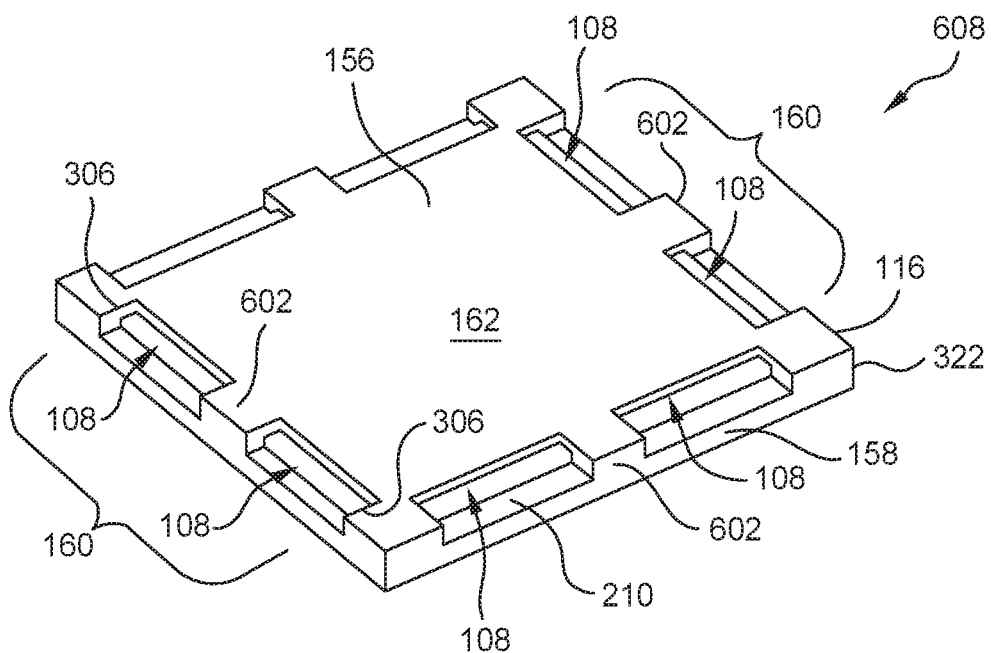
FIG. 6 is a top isometric view of another example of a cover that may be utilized with the electronic device of FIG. 1.

Turning now to the bottom and perspective views of the cover 154 depicted in FIG. 5 and FIG. 6, each window 160 may include two or more apertures 108. The apertures 108 may be laterally spaced side-by-side, vertically stacked one on top of the other, a combination of both laterally spaced and vertically stacked, or other suitable arrangement. It is also contemplated that one window 160 may have one or more apertures 108, while another window 160 on a different sidewall 206 may have a different number of apertures 108. For example, in the perspective view of the cover 154 illustrated in FIG. 5, each window 160 of each sidewall 206 has a single aperture 108.

In another example shown in the perspective view of a cover 600 illustrated in FIG. 6, windows 160 on each sidewall 206 have at least two apertures 108. The apertures 108 are separated by a web 602 of material connecting the top 156 of the cover 600 to the lip 158 of the cover 154. Although only two apertures 108 per window 160 are illustrated in FIG. 6, each window 160 may include three or more apertures 108, each aperture separated by a web 602. In other respects, the cover 600 is essentially identical to the cover 154, and as such, may be utilized in the chip package 110 as described above.

Figure 7:
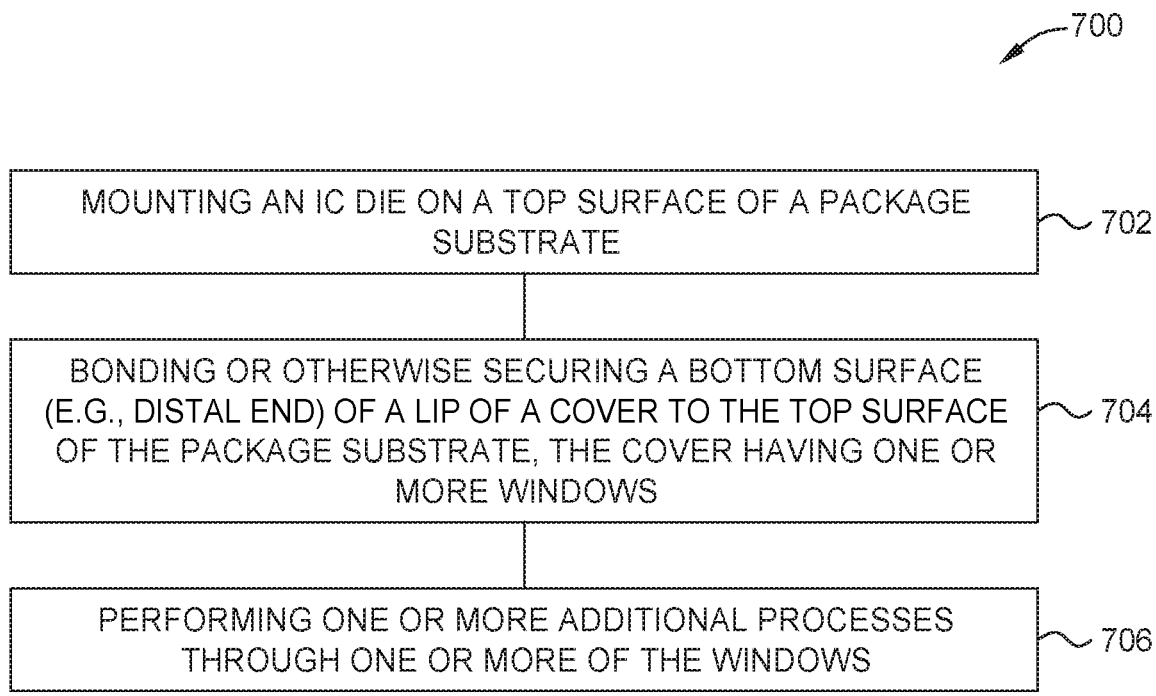
FIG. 7 is a block diagram of one example of a method of fabricating a chip package having a cover with an elongated window.

FIG. 7 is a block diagram of one example of a method 700 for forming a chip package, such as the chip package 110 described above, among others. The method 700 begins at operation 702 by mounting an IC die 114 on a top surface 102 of a package substrate 122. Mounting of the IC die 114 on the package substrate 122 includes making electrical connections between the circuitry of the die and substrate, for example, through solder or other electro-mechanical connections.

At operation 704, a bottom surface (e.g., distal end 202) of a lip 158 of a cover 154 is bonded or otherwise secured to the top surface 102 of the package substrate 122. Operation 704 encloses the IC die 114 in an internal volume 106 defined between the cover 154 and the package substrate 122, with one or more windows 160 formed through sidewalls 206 of the cover 154 exposing the IC die 114 and optional surface mounted circuit components 104 to an environment 200 exterior to the chip package 110. Operation 704 also contiguously contacts the sidewalls of the cover circumscribing the IC die to the package substrate, thus advantageously providing a very warpage resistant assembly which beneficially improves reliability.

At operation 706, one or more additional processes are performed through one or more the windows 160. In one example, the operation 706 may include disposing a cleaning fluid through the one or more windows. Examples of cleaning fluids that may be disposed through the window 160 include flux cleaners, surface cleaners, degreasers, deionized water, alcohol, solvents or other suitable cleaners. More than one cleaning fluid may be disposed through the window 160 into the internal volume 106. Additionally, while the cleaning fluid is disposed through one or more windows 160 into the internal volume 106, some or all of the cleaning fluid may exit the internal volume 106 through one or more of the other windows 160.

In another example, operation 706 may include disposing a rinsing fluid through the one or more windows. Examples of rinsing fluids that may be disposed through the window 160 include deionized water, alcohol, clean dry air, nitrogen, inert gas, or other suitable rinsing fluid. More than one rinsing fluid may be disposed through the window 160 into the internal volume 106. Additionally, while the rinsing fluid is disposed through one or more windows 160 into the internal volume 106, some or all of the rinsing fluid may exit the internal volume 106 through one or more of the other windows 160. Furthermore, operation 706 may essentially consist of only dispensing a rinsing fluid into the internal volume 106, or may comprise dispensing a rinsing fluid into the internal volume 106 in conjunction with one or more operations. For example, dispensing a rinsing fluid into the internal volume 106 may be performed before, after, or before and after dispensing a cleaning fluid into the internal volume 106.

In yet another example, operation 706 may include flowing a cooling fluid through the one or more windows. The cooling fluid may include nitrogen or clean dry air. The cooling fluid may be provided through the one or more windows while the chip package 110 is under test or in operation. The cooling fluid may potentially lower operating temperatures, thus improving reliability. Furthermore, operation 706 may essentially consist of only flowing a cooling fluid through the internal volume 106, or may comprise flowing a cooling fluid through the internal volume 106 in conjunction with one or more operations. For example, flowing a cooling fluid through the internal volume 106 may be performed before, after, or before and after dispensing a cleaning and/or rinsing fluid into the internal volume 106.

In yet another example, operation 706 may include dispensing a molding material through one or more of the windows 160. The molding material is utilized to encapsulate the IC die. Examples of molding material include polymer potting compounds, epoxy, silicone, silicone with fillers, and room-temperature-vulcanizing (RTV) silicone, among others. The molding material may be utilized to further improve stiffness of the chip package and/or heat transfer between the IC die and cover, thus improving reliability. Furthermore, operation 706 may essentially consist of only dispensing a molding material through the internal volume 106, or may comprise dispensing a molding material into the internal volume 106 in conjunction with one or more operations. For example, dispensing a molding material into the internal volume 106 may be performed before, after, or before and after dispensing a cleaning and/or rinsing fluid into the internal volume 106.

In still another example, operation 706 may include dispensing an underfill material through one or more of the windows 160. The underfill material is utilized to fill the interstitial space between the solder connection coupling the IC die to the package substrate. The underfill material may be utilized to further improve stiffness of the chip package, and/or protect the solder connection between the IC and the package substrate, thus improving reliability. Furthermore, operation 706 may essentially consist of only dispensing an underfill material, or may comprise dispensing an underfill material through in conjunction with one or more operations. For example, dispensing an underfill material may be performed before, after, or before and after dispensing a cleaning and/or rinsing fluid into the internal volume 106; and may optionally also be performed prior to dispensing a molding material or a cooling fluid into the internal volume 106.

Thus, as described above, a chip package and method for fabricating the same are provided which utilize a cover having elongated windows with elongated apertures. The cover is configurable to provide an overall stiffness of the chip package to provide an appropriate resistance to warpage while advantageously allowing access to the interior of the chip package. Advantageously, the elongated apertures of the windows allow superior access to the large areas of the interior of the chip package, which can be leveraged to at least one of further clean the chip package, add stiffening materials, and protect solder connections, among others. Thus, the enhanced stiffness provided by the cover and large and expansive access to the interior of the chip package provided through the elongated windows, improves the reliability and performance of the chip package.

While the foregoing is directed to embodiments of the present invention, other and further embodiments of the invention may be devised without departing from the basic scope thereof, and the scope thereof is determined by the claims that follow.

What is claimed is:

1. A chip package comprising:
   a package substrate;
   an integrated circuit (IC) die; and
   a cover disposed over the IC die, the cover comprising:
      a lower surface facing the IC die;
      an upper surface facing away from the IC die;
      a lip extending from the lower surface, the lip secured to the package substrate and enclosing a volume between the lower surface and the package substrate, the IC die residing in the volume;
      a first sidewall extending from a first edge of the upper surface to a bottom of the lip; and
      a first elongated window formed through the first sidewall, the first elongated window exposing the volume through the cover.

2. The chip package of claim 1, wherein the first elongated window is formed through the lip and the upper surface.

3. The chip package of claim 1, wherein the lip circumscribes the IC die and continuously contacts the package substrate.

4. The chip package of claim 1, wherein the first elongated window has a width in a direction coplanar with the first sidewall, parallel to the first edge, and perpendicular an edge of the upper surface that is greater than a width of the IC die in the same direction.

5. The chip package of claim 1, wherein the cover further comprises:
   a second sidewall extending from a second edge of the upper surface to the bottom of the lip, the second sidewall disposed adjacent the first sidewall; and
   a second elongated window formed through the second sidewall, the second elongated window exposing the volume through the cover.

6. The chip package of claim 5, wherein the cover further comprises:
   a third sidewall extending from a third edge of the upper surface to the bottom of the lip, the third sidewall disposed adjacent the second sidewall and opposite the first sidewall; and
   a third elongated window formed through the third sidewall, the third elongated window exposing the volume through the cover.

7. The chip package of claim 6, wherein the cover further comprises:
   a fourth sidewall extending from a third edge of the upper surface to the bottom of the lip, the fourth sidewall disposed adjacent the third sidewall and opposite the second sidewall;
   a fourth elongated window formed through the fourth sidewall, the third elongated window exposing the volume through the cover; and
   first, second, third and fourth corner edges extending from a bottom of the lip to the upper surface, the first corner edge connecting the first sidewall to the second sidewall and separating the first elongated window from the second elongated window, the second corner edge connecting the second sidewall to the third sidewall and separating the second elongated window from the third elongated window, the third corner edge connecting the third sidewall to the fourth sidewall and separating the third elongated window from the fourth elongated window, the fourth corner edge connecting the fourth sidewall to the first sidewall and separating the fourth elongated window from the first elongated window.

8. The chip package of claim 5, wherein the first elongated window is separated from the second elongated window by a portion of the first sidewall and a portion of the second sidewall.

9. The chip package of claim 1, wherein the first elongated window is separated from the package substrate by a portion of the lip.

10. The chip package of claim 1, wherein the first elongated window further comprises:
   a first aperture separated from a second aperture by a web connecting the first sidewall with the upper surface, the first and second apertures exposing the volume through the cover.

11. The chip package of claim 10, wherein the first and second apertures extend through the upper surface.

12. A chip package comprising:
   a package substrate;
   an integrated circuit (IC) die; and
   a cover disposed over the IC die, the cover comprising:
      a lower surface facing the IC die;
      an upper surface facing away from the IC die;
      a lip extending from the lower surface, the lip contacting the package substrate and enclosing a volume between the lower surface and the package substrate, the IC die residing in the volume;
      a first sidewall extending from a first edge of the upper surface to the bottom of the lip;

a first elongated window formed through the first sidewall and the upper surface, the first elongated window exposing the volume through the cover, the first elongated window having a width greater than a width of the IC die;

a second sidewall extending from a second edge of the upper surface to the bottom of the lip, the second sidewall facing away from the first sidewall;

a second elongated window formed through the second sidewall and the upper surface, the second elongated window exposing the volume through the cover, the second elongated window having a width greater than the width of the IC die.

13. The chip package of claim 12, wherein the lip circumscribes the IC die and continuously contacts the package substrate.

14. The chip package of claim 13, wherein the cover further comprises:

a third sidewall extending from a third edge of the upper surface to the bottom of the lip, the third sidewall disposed between the second sidewall and the first sidewall; and a third elongated window formed through the third sidewall and the upper surface, the third elongated window exposing the volume through the cover.

15. The chip package of claim 13, wherein the first elongated window is separated from the package substrate by a portion of the lip.

16. The chip package of claim 13, wherein the first elongated window further comprises:

a first aperture separated from a second aperture by a web connecting the first sidewall with the upper surface, the first and second apertures exposing the volume through the cover.

* * * * *